(12) United States Patent
Ukei et al.

(10) Patent No.: US 11,145,988 B2
(45) Date of Patent: Oct. 12, 2021

(54) ELECTROMAGNETIC WAVE ABSORBER

(71) Applicant: NITTO DENKO CORPORATION, Ibaraki (JP)

(72) Inventors: Hiroichi Ukei, Ibaraki (JP); Takehiro Ui, Ibaraki (JP); Kazuto Yamagata, Ibaraki (JP); Yuki Takeda, Ibaraki (JP); Hironobu Machinaga, Ibaraki (JP); Yuya Kitagawa, Ibaraki (JP); Kazuaki Sasa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 598 days.

(21) Appl. No.: 15/774,077

(22) PCT Filed: Dec. 14, 2016

(86) PCT No.: PCT/JP2016/087248
§ 371 (c)(1),
(2) Date: May 7, 2018

(87) PCT Pub. No.: WO2017/104711
PCT Pub. Date: Jun. 22, 2017

(65) Prior Publication Data
US 2018/0319138 A1   Nov. 8, 2018

(30) Foreign Application Priority Data

Dec. 14, 2015 (JP) .............................. JP2015-243395
Dec. 13, 2016 (JP) .............................. JP2016-241156

(51) Int. Cl.
*H01Q 17/00* (2006.01)
*B32B 27/30* (2006.01)
(Continued)

(52) U.S. Cl.
CPC ............... *H01Q 17/00* (2013.01); *B32B 7/12* (2013.01); *B32B 27/08* (2013.01); *B32B 27/18* (2013.01);
(Continued)

(58) Field of Classification Search
CPC ...... H05K 9/0088; H05K 9/00; H05K 9/0094; H01Q 17/00–008; H01Q 1/3283;
(Continued)

(56) References Cited

U.S. PATENT DOCUMENTS 4,726,980 A  *  2/1988  Ishikawa .............. H01Q 17/005
                                                           428/212
6,104,534 A      8/2000  Ohta et al.
(Continued)

FOREIGN PATENT DOCUMENTS

JP      H05335832 A  *  12/1993
JP      6-120689 A        4/1994
(Continued)

OTHER PUBLICATIONS

Kondo, A., Toyota, M., Soh, T., & Hashimoto, O. (2004). A λ/4 wave absorber for both 60 and 76 GHz bands. Transactions of the Institute of Electrical Engineers of Japan, Part C, 124-C(2), 335-40. doi:http://dx.doi.org/10.1541/ieejeiss. 124.335 (Year: 2004).*
(Continued)

*Primary Examiner* — Matthew M Barker
(74) *Attorney, Agent, or Firm* — Westerman, Hattori, Daniels & Adrian LLP

(57) ABSTRACT

For the purpose of providing an electromagnetic wave absorber usable for radar having a high revolution and sufficiently adaptable to a plurality of radars different in frequency, the bandwidth of a frequency band in which an
(Continued)

electromagnetic wave absorption amount is not less than 20 dB is not less than 2 GHz, within a frequency band of 60 to 90 GHz.

11 Claims, 5 Drawing Sheets

(51) Int. Cl.
  *B32B 27/08* (2006.01)
  *B32B 15/08* (2006.01)
  *B32B 33/00* (2006.01)
  *B32B 7/12* (2006.01)
  *H05K 9/00* (2006.01)
  *B32B 27/28* (2006.01)
  *H01Q 1/32* (2006.01)
  *B32B 27/18* (2006.01)
  *G01S 13/931* (2020.01)
  *B32B 15/20* (2006.01)

(52) U.S. Cl.
  CPC .......... *B32B 27/28* (2013.01); *B32B 27/30* (2013.01); *B32B 27/304* (2013.01); *B32B 27/306* (2013.01); *H01Q 1/3283* (2013.01); *H05K 9/00* (2013.01); *H05K 9/0088* (2013.01); *H05K 9/0094* (2013.01); *B32B 15/08* (2013.01); *B32B 15/20* (2013.01); *B32B 33/00* (2013.01); *B32B 2255/06* (2013.01); *B32B 2255/10* (2013.01); *B32B 2255/205* (2013.01); *B32B 2264/102* (2013.01); *B32B 2264/105* (2013.01); *B32B 2307/202* (2013.01); *B32B 2307/204* (2013.01); *B32B 2307/40* (2013.01); *B32B 2457/00* (2013.01); *G01S 13/931* (2013.01)

(58) Field of Classification Search
  CPC ......... B32B 7/12; B32B 27/304; B32B 27/08; B32B 27/306; B32B 27/28; B32B 27/30; B32B 27/18; B32B 2264/105; B32B 2457/00; B32B 2255/205; B32B 2255/06; B32B 2264/102; B32B 2255/10; B32B 15/08; B32B 15/20; B32B 33/00; B32B 2307/202; B32B 2307/204; B32B 2307/40; G01S 13/931
  See application file for complete search history.

(56) References Cited

U.S. PATENT DOCUMENTS

| | | | | |
|---|---|---|---|---|
| 6,495,752 B1* | 12/2002 | Sugizaki | ........... | B32B 27/06 174/389 |
| 6,670,546 B2* | 12/2003 | Okayama | ........... | H01Q 17/00 174/391 |
| 6,683,246 B2* | 1/2004 | Hashimoto | ........... | H05K 9/0088 174/394 |
| 6,870,497 B2* | 3/2005 | Kondo | ........... | H01Q 17/004 333/81 R |
| 7,846,546 B2* | 12/2010 | Shibata | ........... | C04B 35/565 428/403 |
| 8,031,104 B2* | 10/2011 | Janis | ........... | H01Q 17/00 342/1 |
| 8,889,570 B2* | 11/2014 | Matsumura | ........... | C08F 265/04 442/6 |
| 9,108,388 B2* | 8/2015 | Egami | ........... | B32B 5/08 |
| 9,541,678 B2* | 1/2017 | Durant | ........... | H01Q 17/001 |
| 2002/0025429 A1* | 2/2002 | Fukui | ........... | B32B 15/12 428/341 |
| 2003/0107025 A1* | 6/2003 | Okayama | ........... | H05K 9/0083 252/500 |
| 2007/0296624 A1* | 12/2007 | Katano | ........... | H01Q 17/00 342/1 |
| 2011/0068283 A1* | 3/2011 | Lu | ........... | H05K 9/0088 250/515.1 |
| 2014/0132439 A1* | 5/2014 | Hirose | ........... | H05K 9/0052 342/1 |
| 2018/0354242 A1* | 12/2018 | Hashimoto | ........... | C09D 7/61 |

FOREIGN PATENT DOCUMENTS

| | | | | |
|---|---|---|---|---|
| JP | 7-283577 A | 10/1995 | | |
| JP | H08-307088 A | 11/1996 | | |
| JP | 10-13082 A | 1/1998 | | |
| JP | 11-73119 A | 3/1999 | | |
| JP | 2000-59066 A | 2/2000 | | |
| JP | 2000-243146 A | 9/2000 | | |
| JP | 2003-133784 A | 5/2003 | | |
| JP | 2004006436 A | * 1/2004 | | |
| JP | 2004-319788 A | 11/2004 | | |
| JP | 2005-85966 A | 3/2005 | | |
| KR | 20040089283 A | * 10/2004 | ........... | H01Q 17/008 |

OTHER PUBLICATIONS

International Search Report dated Mar. 14, 2017, issued in Counterpart of International Application No. PCT/JP2016/087248 (1 page).
Notice of Reasons for Revocation dated Oct. 7, 2019, issued in counterpart JP Application No. 2016-241731, with English translation. (23 pages).
"The Encyclopedia of Plastics and Functional Polymer Materials", Encyclopedia Publishing Center—Sangyo Chosakai, The First Impression of the First Edition, Feb. 20, 2004, pp. 81 and 251, with English translation. (6 pages).
Office Action dated Apr. 23, 2020, issued in counterpart TW Application No. 105141407, with English translation (9 pages).
Office Action dated Jun. 3, 2020, issued in counterpart JP Application No. 2016-241731 (Opposition case No. 2019-7000555), with English translation (41 pages).
Office Action dated Jun. 26, 2018, issued in counterpart Japanese Application No. 2016-241731, with English machine translation. (6 pages).
Notification of Transmittal of Translation of the International Preliminary Report on Patentability (Form PCT/IB/338) issued in counterpart International Application No. PCT/JP2016/087248 dated Jun. 28, 2018, with Forms PCT/IB/373 and PCT/ISA/237. (8 pages).
Office Action dated Jul. 30, 2020, issued in counterpart TW Application No. 105141407, with English translation (5 pages).
Decision on Opposition dated Dec. 9, 2020, issued in connection with counterpart Japanese Application No. 2016-241731 (w/ English translation; 82 pages).

* cited by examiner

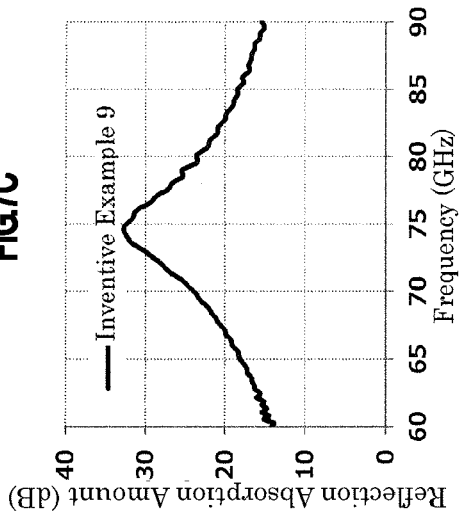
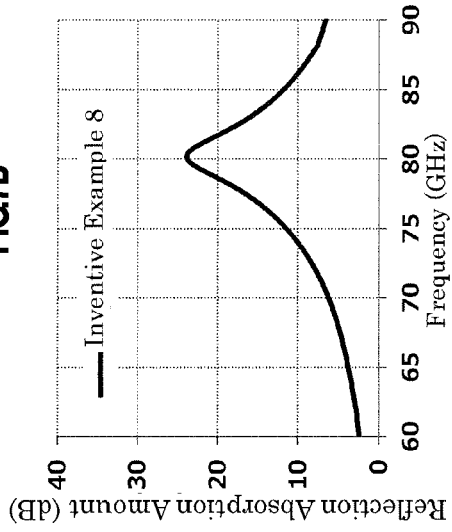
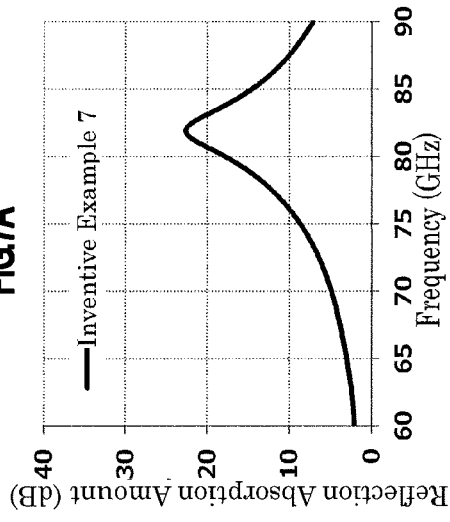
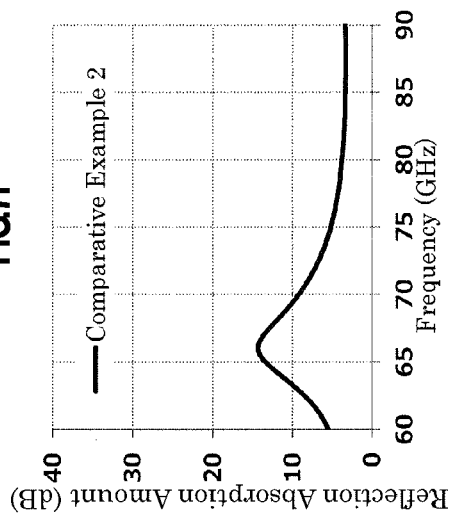
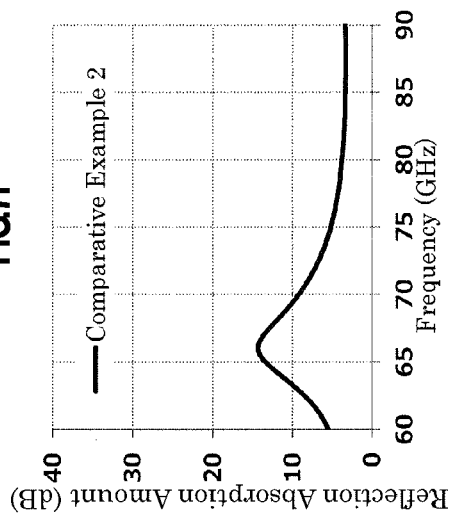
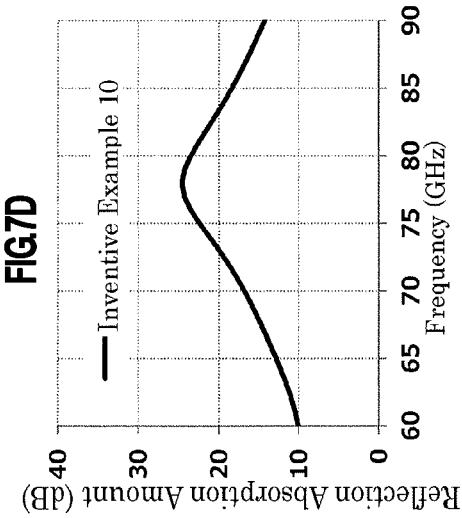

ELECTROMAGNETIC WAVE ABSORBER

TECHNICAL FIELD

The present invention relates to an electromagnetic wave absorber for preventing electromagnetic interference.

BACKGROUND ART

In recent years, the use of electromagnetic waves as an information communication medium has been on the increase. Examples the use of such electromagnetic waves include collision avoidance systems in the field of motor vehicle technology. The collision avoidance systems automatically apply brakes upon sensing obstacles by means of radar, and measure the speed of a neighboring vehicle and a distance between a user's vehicle and the neighboring vehicle to control the speed of the user's vehicle and the distance between the vehicles. For normal operation of the collision avoidance systems and the like, it is important to receive as little unwanted electromagnetic wave radiation (noise) as possible in order to prevent false recognition. For this reason, electromagnetic wave absorbers that absorb noise are sometimes used in these systems and the like (see PTL 1 and PTL 2, for example).

For higher sensing performance in the aforementioned collision avoidance systems and the like, the performance of the radar itself has been on the increase, and the use of radar at a frequency (76.5 GHz and 79 GHz) higher than a conventional frequency (24 GHz) has been promoted. Accordingly, there has been a demand for electromagnetic wave absorbers which highly absorb noise in high frequency bands. For higher radar resolution, operating frequency bands become wider (1 GHz in the case of 76 GHz, and 4 GHz in the case of 79 GHz), and the electromagnetic wave absorbers have been required to have absorption performance over a wide bandwidth. Unfortunately, conventional electromagnetic wave absorbers have problems in being able to provide absorption performance only in a very limited range close to a target frequency and in being unable to cover high frequency bands, as disclosed in PTL 1 and PTL 2. If properties of materials constituting an electromagnetic wave absorber are varied due to an environmental change or a change with time when in use, there is a possibility that absorbable frequencies (absorption peak) are accordingly varied. This results in apprehension that sufficient absorption performance cannot be provided at a set frequency. Another problem lies in that the electromagnetic wave absorber fails to provide absorption performance if the radar frequency is varied even slightly.

For still higher accuracy in the aforementioned collision avoidance systems and the like, it is contemplated that radars different in frequency are used in combination. However, the absorption performance of the electromagnetic wave absorbers is provided only in a very limited range close to a target frequency, as described above. It is hence necessary to prepare different electromagnetic wave absorbers for the respective radars different in frequency. This gives rise to problems of the increased costs of the electromagnetic wave absorbers and the increased gross weight due to the use of the multiplicity of electromagnetic wave absorbers.

RELATED ART DOCUMENTS

Patent Documents

PTL 1: JP-A-HEI6(1994)-120689
PTL 2: JP-A-HEI10(1998)-13082

SUMMARY OF INVENTION

In view of the foregoing, it is therefore an object of the present invention to provide an electromagnetic wave absorber usable for radar having a high resolution and having excellent absorption performance over a wide bandwidth.

To accomplish the aforementioned object, a first aspect of the present invention is intended for an electromagnetic wave absorber having a bandwidth of a frequency band in which an electromagnetic wave absorption amount is not less than 20 dB of not less than 2 GHz, within a frequency band of 60 to 90 GHz.

In particular, a second aspect of the present invention is intended for the electromagnetic wave absorber of the first aspect, comprising: a dielectric layer; a resistive layer provided on a first surface of the dielectric layer; and an electrically conductive layer provided on a second surface of the dielectric layer and having a sheet resistance lower than that of the resistive layer, wherein the dielectric layer has a relative dielectric constant in the range of 1 to 10. A third aspect of the present invention is intended for the electromagnetic wave absorber of the first aspect, comprising: a dielectric layer; and an electrically conductive layer provided on one surface of the dielectric layer, wherein the dielectric layer has a relative dielectric constant in the range of 1 to 10.

A fourth aspect of the present invention is intended for the electromagnetic wave absorber of the second or third aspect, wherein the dielectric layer is a polymer film. A fifth aspect of the present invention is intended for the electromagnetic wave absorber of the second to fourth aspects, wherein the dielectric layer is a foam. A sixth aspect of the present invention is intended for the electromagnetic wave absorber of the second to fifth aspects, wherein the dielectric layer contains at least one of a magnetic material and a dielectric material. A seventh aspect of the present invention is intended for the electromagnetic wave absorber of the second and fourth to sixth aspects, wherein the resistive layer contains indium tin oxide. An eighth aspect of the present invention is intended for the electromagnetic wave absorber of the second and fourth to seventh aspects, wherein the sheet resistance of the resistive layer is in the range of 320 to 500 Ω/□.

A ninth aspect of the present invention is intended for the electromagnetic wave absorber of the second to eighth aspects, wherein the electrically conductive layer contains indium tin oxide. A tenth aspect of the present invention is intended for the electromagnetic wave absorber of the second to eighth aspects, wherein the electrically conductive layer contains at least one of aluminum and an alloy thereof. An eleventh aspect of the present invention is intended for the electromagnetic wave absorber of the first to tenth aspects further comprising an adhesive layer, wherein the adhesive layer is provided outside the electrically conductive layer.

The present inventors have directed attention toward a relationship between the frequency of radars having an increased resolution and the amplitude of the wave motion thereof, and have diligently made studies for the purpose of obtaining an electromagnetic wave absorber having excellent absorption performance adaptable to these radars. As a result, the present inventors have found that an electromagnetic wave absorber characterized in that the bandwidth of a frequency band in which an electromagnetic wave absorption amount is not less than 20 dB is not less than 2 GHz within a frequency band of 60 to 90 GHz solves the aforementioned problem. Thus, the present inventors have attained the present invention.

The electromagnetic wave absorber according to the present invention is characterized in that the bandwidth of a frequency band in which an electromagnetic wave absorption amount is not less than 20 dB is not less than 2 GHz within a frequency band of 50 to 90 GHz. Thus, the electromagnetic wave absorber is capable of excluding noise in a wide frequency band.

In particular, the electromagnetic wave absorber comprising: a dielectric layer; a resistive layer provided on a first surface of the dielectric layer; and an electrically conductive layer provided on a second surface of the dielectric layer and having a sheet resistance lower than that the resistive layer, wherein the dielectric layer has a relative dielectric constant in the range of 1 to 10 is capable of not only widening the absorption bandwidth but also providing the dielectric layer having an easy-to-control thickness. This provides the electromagnetic wave absorber having a more uniform electromagnetic wave absorbing effect.

Also, the electromagnetic wave absorber comprising: a dielectric layer; and an electrically conductive layer provided on one surface of the dielectric layer, wherein the dielectric layer has a relative dielectric constant in the range of 1 to 10 is capable of not only widening the absorption bandwidth but also facilitating the setting and manufacture thereof. This achieves the electromagnetic wave absorber at low costs.

BRIEF DESCRIPTION OF DRAWINGS

FIGS. 7A to 7F are graphs showing relationships between frequencies (GHz) and reflection absorption amounts (dB) measured in Inventive Examples 7 to 10 and Comparative Examples 1 and 2, respectively.

DESCRIPTION OF EMBODIMENTS

Figure 1:
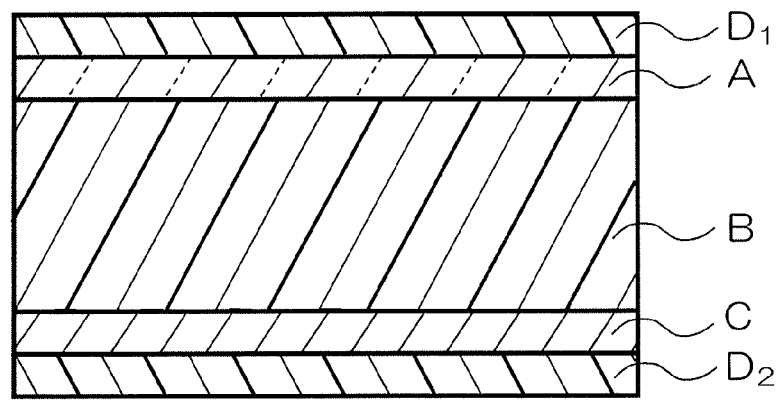
FIG. 1 is a sectional view of an electromagnetic wave absorber according to a first embodiment of the present invention.

Next, embodiments according to the present disclosure will now be described in detail with reference to the drawings. It should be noted that the present disclosure is not limited to the embodiments.

An electromagnetic wave absorber according to the embodiments of the present disclosure has a bandwidth of a frequency band in which an electromagnetic wave absorption amount is not less than 20 dB of not less than 2 GHz, preferably not less than 5 GHz, and more preferably not less than 10 GHz, within a frequency band of 60 to 90 GHz. The upper limit of the bandwidth is in general 30 GHz. Preferably, the bandwidth is not less than 2 GHz, more preferably not less than 5 GHz, and further preferably not less than 10 GHz, within a frequency band of 70 to 85 GHz. The upper limit of the bandwidth is in general 30 GHz.

The electromagnetic wave absorption amount and the bandwidth of a frequency band in which an electromagnetic wave absorption amount is not less than 20 dB are measured, for example, by a reflected power method, a waveguide method or the like. In the present disclosure, a reflection absorption amount is measured by irradiating a sample with an electromagnetic wave at an oblique incidence angle of 15 degrees through the use of an electromagnetic wave absorber (electromagnetic wave absorbing material) and measuring return loss using a return loss measuring device LAF-26.5B available from Keycom Corporation, pursuant to JIS R 1679 (Measurement methods for reflectivity of electromagnetic wave absorber in millimeter wave frequency), and is defined as an electromagnetic wave absorption amount. Also, the frequency band in which the electromagnetic wave absorption amount is not less than 20 dB is determined from a reflection absorption curve obtained by the aforementioned measurement, and the bandwidth of the frequency band in which the electromagnetic wave absorption amount is not less than 20 dB is defined.

This configuration is capable of excluding an electromagnetic wave having a high frequency, e.g. an electromagnetic wave having a specific wavelength within a frequency band of 76 to 81 GHz, with reliability. Thus, even when radar at a frequency close to 76 to 81 GHz is employed as the radar having a higher resolution, this configuration excludes generated noise with reliability. If properties of materials constituting the electromagnetic wave absorber are varied due to an environmental change or a change with time and absorbable frequencies (absorption peak) are accordingly varied, sufficient absorption performance is provided at a frequency of radar set as a target to be excluded. Also, if the frequency of radar is varied, sufficient absorption performance is provided. If radars different in frequency near the aforementioned frequency are used, noise is excluded from the radars with reliability. This eliminates the need, to use electromagnetic wave absorbers different in performance for the respective radars different in frequency as in the background art, to thereby achieve low costs.

The electromagnetic wave absorber according to the embodiments of the present disclosure may be any one of the following types: a magnetic electromagnetic wave absorber utilizing a magnetic loss; a dielectric electromagnetic wave absorber utilizing a dielectric loss; an electrically conductive electromagnetic wave absorber utilizing a resistance loss; and a λ/4 type electromagnetic wave absorber. In particular, the λ/4 type electromagnetic wave absorber is preferable from the viewpoints of durability, lightweight properties and ease of making films thin. The magnetic electromagnetic wave absorber and the dielectric electromagnetic wave absorber are preferable from the viewpoint of excellent workability.

As shown in FIG. 1, the electromagnetic wave absorber according to an embodiment of the present disclosure which is the aforementioned λ/4 type electromagnetic wave absorber includes, for example, a resistive layer A, a dielectric layer B, and an electrically conductive layer C which are arranged in the order named. This electromagnetic wave absorber further includes a resin layer $D_1$ provided outside the resistive layer A, and a resin layer $D_2$ provided outside the electrically conductive layer C. The components are shown schematically in FIG. 1. The thickness, size and the like of the components shown in FIG. 1 are different from the actual ones (the same holds true for the following figures). The resin layer $D_1$ and $D_2$ are optional components because the resistive layer A, the dielectric layer B, and the electrically conductive layer C are components that produce a sufficient effect.

The resistive layer A, which is required to allow an electromagnetic wave to pass therethrough into the electromagnetic wave absorber, preferably has a relative dielectric constant close to that of air. In general, indium tin oxide (referred to hereinafter as "ITO") is used for the resistive layer A. In particular, ITO as a main component of the resistive layer A preferably contains 20 to 40 wt. % of $SnO_2$, and more preferably 25 to 35 wt. % of $SnO_2$, from the viewpoints of its extremely stable amorphous structure and its capability of suppressing variations in sheet resistance of the resistive layer A under high-temperature and high-humidity environments. The expression "as a main component" as used in the present disclosure means a component that influences the properties of the material. Also, the expression "as a main component" means a component that generally makes up at least 50% by mass of the whole material, and includes meaning that the whole consists only of the main component.

The sheet resistance of the resistive layer A is preferably in the range of 320 to 500Ω/□, and more preferably in the range of 360 to 450Ω/□. When the sheet resistance of the resistive layer A is in the aforementioned range, the electromagnetic wave having a wavelength (cycle) used for various purposes in millimeter wave radar or submillimeter wave radar are selectively absorbed easily.

The thickness of the resistive layer A is preferably in the range of 15 to 100 nm, and more preferably in the range of 25 to 50 nm. If the resistive layer A is too thick or too thin, the reliability of the sheet resistance value tends to decrease when a change with time or an environmental change is effected.

The dielectric layer B is obtained by molding a resin composition having a predetermined relative dielectric constant so that the resin composition will have a predetermined thickness after being cured in accordance with the wavelength of the electromagnetic wave intended to be absorbed, and then curing the resin composition. Preferable examples of the aforementioned resin composition include: synthetic resins such as ethylene-vinyl acetate copolymer (EVA), vinyl chloride, urethane, acrylic, acrylic urethane, polyolefin, polyethylene, polypropylene, silicone, polyethylene terephthalate, polyester, polystyrene, polyimide, polycarbonate, polyamide, polysulfone, polyether sulfone and epoxy; and synthetic rubber materials such as polyisoprene rubber, polystyrene-butadiene rubber, polybutadiene rubber, chloroprene rubber, acrylonitrile-butadiene rubber, butyl rubber, acrylic rubber, ethylene propylene rubber and silicone rubber which are used as resin components. In particular, EVA or acrylic resin is preferably used from the viewpoints of moldability and relative dielectric constant. These resin compositions may be used either alone or in combination. The dielectric layer B may be comprised of a single layer or a plurality of layers.

A foam obtained by foaming the aforementioned materials may be used for the dielectric layer B because the smaller the relative dielectric constant of the dielectric layer B is, the more easily a wider band is achieved. A highly flexible foam is preferably used as such a foam.

The relative dielectric constant of the dielectric layer B is preferably in the range of 1 to 10, more preferably in the range of 1 to 5, and further preferably in the range of 1 to 3. When the relative dielectric constant is in the aforementioned range, the dielectric layer B may be set to an easy-to-control thickness, and the bandwidth of the frequency band in which the electromagnetic wave absorption amount is not less than 20 dB may be set to a wider bandwidth. This provides an electromagnetic wave absorber having more uniform absorption performance.

The relative dielectric constant of the dielectric layer B may be measured at 10 GHz by a cavity resonator perturbation method through the use of a network analyzer N5230C available from Agilent Technologies Japan, Ltd., a cavity resonator CP531 available from Kanto Electronic Application and Development Inc. or the like.

The thickness of the dielectric layer B is preferably in the range of 50 to 2000 μm, more preferably in the range of 100 to 1500 μm, and further preferably in the range of 100 to 1000 μm. If the dielectric layer B is too thin, it is difficult to ensure the dimensional accuracy of the thickness thereof, which in turn results in a danger that the accuracy of the absorption performance decreases. If the dielectric layer B is too thick, the increase in weight makes the dielectric layer B difficult to handle, and material costs tend to increase.

The electrically conductive layer C is disposed in order to reflect an intended electromagnetic wave near the back surface of the electromagnetic wave absorber. The electrically conductive layer C has a sheet resistance sufficiently lower than that of the resistive layer A. Based on these facts, examples of the material of the electrically conductive layer C include ITO, aluminum (Al), copper (Cu), nickel (Ni), chromium (Cr), molybdenum (No) and alloys of these metals. In particular, the provision of a transparent electromagnetic wave absorber is achieved by the use of ITO for the electrically conductive layer C. This not only allows the electromagnetic wave absorber to become applicable to locations where transparency is required but also achieves improvements in workability. Thus, in particular, ITO containing 5 to 15 wt. % of $SnO_2$ is preferably used. When ITO is used for the electrically conductive layer C, the thickness of the electrically conductive layer C is preferably in the range of 20 to 200 nm, and more preferably in the range of 50 to 150 nm. If the electrically conductive layer C is too thick, the electrically conductive layer C is prone to suffer cracks due to stresses. If the electrically conductive layer C is too thin, it tends to be difficult to obtain a desired low resistance value. On the other hand, Al or alloys thereof are preferably used from the viewpoints of easily lowering the sheet resistance value and further reducing noise. When Al or alloys thereof are used for the electrically conductive layer C, the thickness of the electrically conductive layer C is preferably in the range of 20 nm to 100 μm, and more preferably in the range of 50 nm to 50 μm. If the electrically conductive layer C is too thick, the electromagnetic wave absorber tends to be rigid and accordingly difficult to handle. If the electrically conductive layer c is too thin, it tends to be difficult to obtain a desired low resistance value. The sheet resistance of the electrically conductive layer C is preferably in the range of $1.0 \times 10^{-7}$ Ω to 100Ω, and more preferably in the range of $1.0 \times 10^{-7}$ Ω to 20Ω.

The resin layers $D_1$ and $D_2$ are substrates for the formation of the resistive layer A or the electrically conductive layer C by sputtering or the like, and have the function of protecting the resistive layer A and the electrically conductive layer C against external shocks or the like after the formation thereof in the electromagnetic wave absorber. The resin layers $D_1$ and $D_2$ are preferably made of a material resistant to high temperatures of evaporation, sputtering and the like for use in the formation of the resistive layer A or the electrically conductive layer C. Examples of the material of the resin layers $D_1$ and $D_2$ include polyethylene terephthalate (PET), polyethylene naphthalate (PEN), acrylic (PMMA) polycarbonate (PC) and cycloolefin polymer (COP). In particular, PET is preferably used because of its excellent heat resistance and its good balance between dimensional stability and costs. The resin layers $D_1$ and $D_2$ may be made of the same material or different materials. Each of the resin layers $D_1$ and $D_2$ may be comprised of a single layer or a plurality of layers. Also, the resin layers $D_1$ and $D_2$ may be dispensed with.

The thickness of each of the resin layers $D_1$ and $D_2$ is preferably in the range of 10 to 125 μm, and more preferably in the range of 20 to 50 μm. If the resin layers $D_1$ and $D_2$ are too thin, wrinkles or deformation is prone to occur in the resin layers $D_1$ and $D_2$ during the formation of the resistive layer A. If the resin layers $D_1$ and $D_2$ are too thick, the bendability of the electromagnetic wave absorber is prone to decrease. The resin layers $D_1$ and $D_2$ may have the same thickness or different thicknesses.

Figure 2:
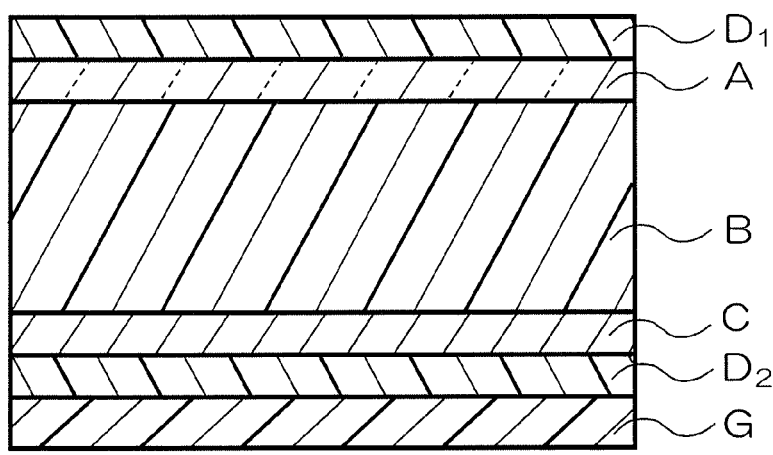
FIG. 2 is a view illustrating the electromagnetic wave absorber shown in FIG. 1 in which an adhesive layer is provided.

The electromagnetic wave absorber according to the aforementioned embodiment includes a laminate comprised of the resistive layer A, the dielectric layer B, the electrically conductive layer C, and the resin layers $D_1$ and $D_2$. However, an additional layer other than these layers A, B, C, $D_1$ and $D_2$ may be provided in the electromagnetic wave absorber. Specifically, additional layers may be provided, for example, outside the resin layer $D_1$, between the resistive layer A and the dielectric layer B, between the dielectric layer B and the electrically conductive layer C, and outside the resin layer $D_2$. For example, the provision of a coating layer (not shown) between the resistive layer A and the dielectric layer B prevents a component in the dielectric layer B from diffusing into the resistive layer A to protect the resistive layer A. Similarly, the provision of a coating layer (not shown) between the electrically conductive layer C and the dielectric layer B prevents a component in the dielectric layer B from diffusing into the electrically conductive layer C to protect the electrically conductive layer C. Alternatively, an adhesive layer G may be provided outside the resin layer $D_2$, as shown in FIG. 2, to facilitate the attachment to another member (to-be-attached member).

Examples of the material of the coating layers include silicon dioxide ($SiO_2$), silicon nitride (SiN), aluminum oxide ($Al_2O_3$), aluminum nitride (AlN), niobium oxide ($Nb_2O_5$), silicon tin oxide (STO), and aluminum-doped zinc oxide (AZO).

Examples of the material of the adhesive layer G used herein include pressure sensitive adhesives such as rubber pressure sensitive adhesives, acrylic pressure sensitive adhesives, silicone pressure sensitive adhesives and urethane pressure sensitive adhesives. Also, adhesive agents such as emulsion adhesive agents, rubber adhesive agents, epoxy adhesive agents, cyanoacrylate adhesive agents, vinyl adhesive agents and silicone adhesive agents may be used as the material of the adhesive layer G. These examples of the material of the adhesive layer G may be selected as appropriate depending on the material and shape of the to-be-attached member. In particular, acrylic pressure sensitive adhesives are preferably used from the viewpoints of their long-term adhesive strength and their high reliability of attachment.

Such an electromagnetic wave absorber (with reference to FIG. 1) is manufactured, for example, in a manner to be described below.

Figure 3A:
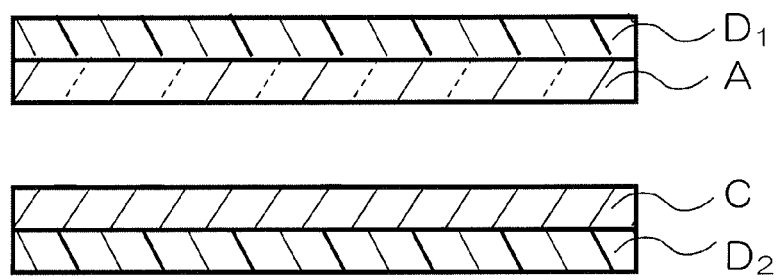
FIGS. 3A and 3B are views illustrating a method of producing the electromagnetic wave absorber shown in FIG. 1.

First, as shown in FIG. 3A, the resistive layer A is formed on (in the figure, beneath) the resin layer $D_1$ molded in film form. Also, the electrically conductive layer C is formed on the resin layer $D_2$ molded in film form. The resistive layer A and the electrically conductive layer C may be formed by sputtering, evaporation or the like. In particular, sputtering is preferably used from the viewpoint of its ability to control the resistance value and the thickness of the layers precisely.

Figure 3B:
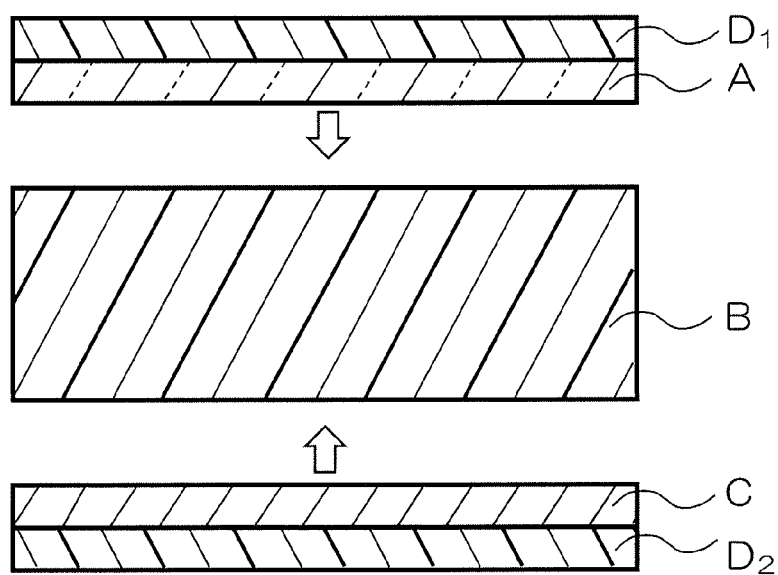

Next, as shown in FIG. 3B, the resin composition for the formation of the dielectric layer B is pressed into film form. Then, the resistive layer A formed on the resin layer $D_1$ is overlaid on a first surface of the dielectric layer B, and the electrically conductive layer C formed on the resin layer $D_2$ is overlaid on a second surface of the dielectric layer B. This provides the electromagnetic wave absorber shown in FIG. 1 and including the resin layer $D_1$, the resistive layer A, the dielectric layer B, the electrically conductive layer C, and the resin layer $D_2$ which are laminated together in the order named.

This provides the electromagnetic wave absorber capable of effectively absorbing the electromagnetic wave having the intended wavelength (cycle) because of the ease of control of the thickness of the dielectric layer B. Also, the resistive layer A and the electrically conductive layer C may be formed separately. This shortens the time required for the manufacture of the electromagnetic wave absorber to achieve the manufacture of the electromagnetic wave absorber at low costs. When the resin layer $D_1$ and $D_2$ are not provided, the electromagnetic wave absorber may be manufactured, for example, by directly sputtering or evaporating the materials of the resistive layer A and the electrically conductive layer C on the dielectric layer B.

Figure 4:
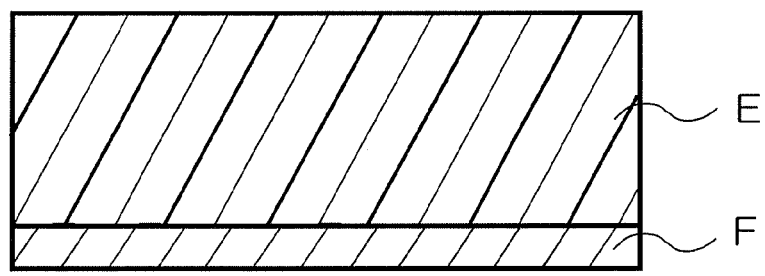
FIG. 4 is a sectional view of an electromagnetic wave absorber according to a second embodiment of the present invention.

Next, as shown in FIG. 4, the electromagnetic wave absorber according to a second embodiment of the present disclosure which is the aforementioned magnetic electromagnetic wave absorber or the dielectric electromagnetic wave absorber includes, for example, a dielectric layer E and an electrically conductive layer F, as shown in FIG. 4. The magnetic electromagnetic wave absorber is an electromagnetic wave absorber which uses a magnetic loss utilizing a following delay of the magnetic moment of an added magnetic material to absorb an electromagnetic wave directed from outside the dielectric layer E. The dielectric electromagnetic wave absorber is an electromagnetic wave absorber which uses a heat loss utilizing a following delay of the polarization of an added dielectric material to absorb an electromagnetic wave directed from outside the dielectric layer E. This electromagnetic wave absorber may be an electromagnetic wave absorber to which a magnetic material and a dielectric material are added in combination.

In the case of the magnetic electromagnetic wave absorber, the dielectric layer E is obtained by molding a resin composition made of the same material as the aforementioned dielectric layer B and further containing a magnetic material so that the resin composition will have a predetermined thickness after being cured, and then curing the resin composition. Examples of the magnetic material are those which use an applied electric field to absorb an electromagnetic wave, and include: electrically conductive carbon such as Ketjen black, acetylene black, furnace black, graphite and expanded graphite; and magnetic powder of iron, nickel and ferrite. In particular, metal carbonyl complexes are preferably used from the viewpoint of excellent dispersibility in resin compositions, and carbonyl iron powder is particularly preferably used.

In the case of the dielectric electromagnetic wave absorber, the dielectric layer E is obtained by molding a resin composition made of the same material as the aforementioned dielectric layer B and further containing a dielectric material so that the resin composition will have a predetermined thickness after being cured, and then curing the resin composition. Examples of the dielectric material are those which use an applied magnetic field to absorb an electromagnetic wave, and include: carbon such as Ketjen black, acetylene black, furnace black, graphite and expanded graphite; and ferroelectric materials such as barium titanate and lead zirconate titanate. In particular, carbon powder is preferably used from the viewpoint of low material costs.

The thickness of the dielectric layer E is preferably in the range of 50 to 2000 μm, and more preferably in the range of 100 to 1500 μm. If the dielectric layer E is too thin, it tends to be difficult to ensure the dimensional accuracy of the thickness thereof. If the dielectric layer E is too thick, not only the material costs become high but also weight is excessively increased.

The relative dielectric constant of the dielectric layer E is preferably in the range of 1 to 10, and more preferably in the range of 1 to 5. When the relative dielectric constant is in the aforementioned range, the dielectric layer E may be set to an easy-to-control thickness, and the bandwidth of the frequency band in which the electromagnetic wave absorption amount is not less than 20 dB may be set to a wider bandwidth. Also, an electromagnetic wave absorber having more uniform absorption performance is provided.

The electrically conductive layer F is disposed in order to reflect the electromagnetic wave having an intended wavelength (cycle) near the back surface of the electromagnetic wave absorber. Thus, examples of the material of the electrically conductive layer F include ITO, aluminum (Al), copper (Cu), nickel (Ni), chromium (Cr), molybdenum (No) and alloys of these metals.

The thickness of the electrically conductive layer F is preferably in the range of 20 nm to 100 μm, and more preferably in the range of 50 nm to 50 μm. If the electrically conductive layer F is too thick, the electrically conductive layer F is prone to suffer stresses and cracks. If the electrically conductive layer F is too thin, it tends to be difficult to obtain a desired low resistance value. The sheet resistance of the electrically conductive layer F is preferably in the range of $1.0 \times 10^{-7} \Omega$, to 100Ω, and more preferably in the range of $1.0 \times 10^{-1} \Omega$ to 20Ω.

Such an electromagnetic wave absorber (with reference to FIG. 4) is manufactured, for example, by sputtering or evaporating the material of the electrically conductive layer on the dielectric layer F molded into film form by pressing or the like.

Figure 5:
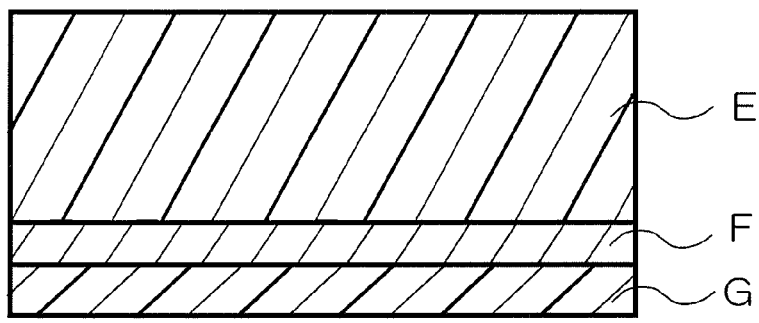
FIG. 5 is a view illustrating the electromagnetic wave absorber shown in FIG. 4 in which an adhesive layer is provided.
Figure 6A:
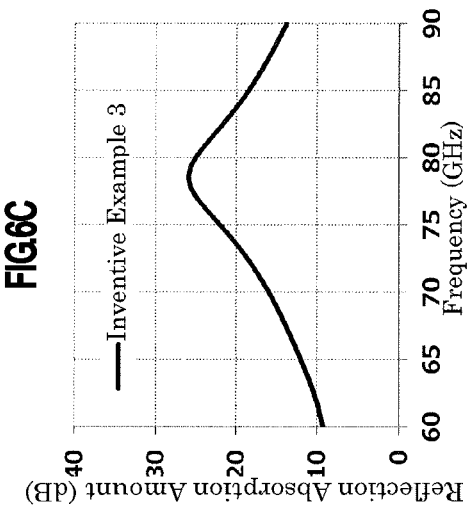
FIGS. 6A to 6F are graphs showing relationships between frequencies (GHz) and reflection absorption amounts (dB) measured in Inventive Examples 1 to 6, respectively.
Figure 6B:
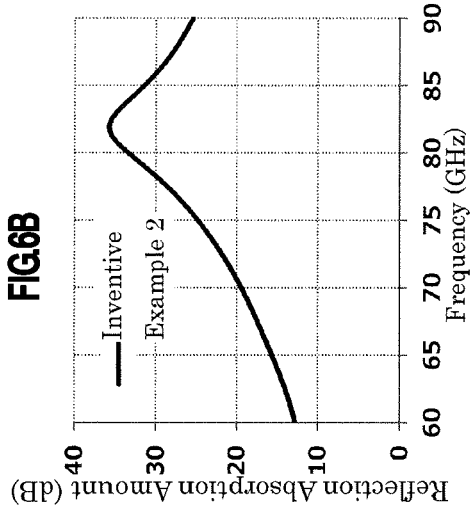
Figure 6C:
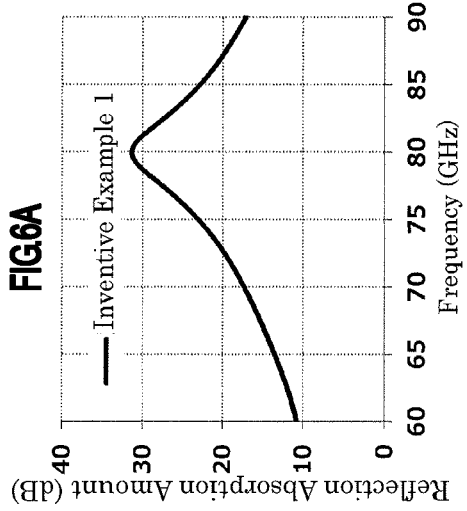
Figure 6D:
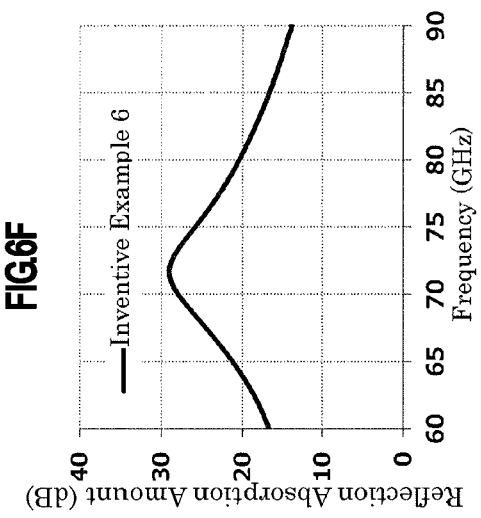
Figure 6E:
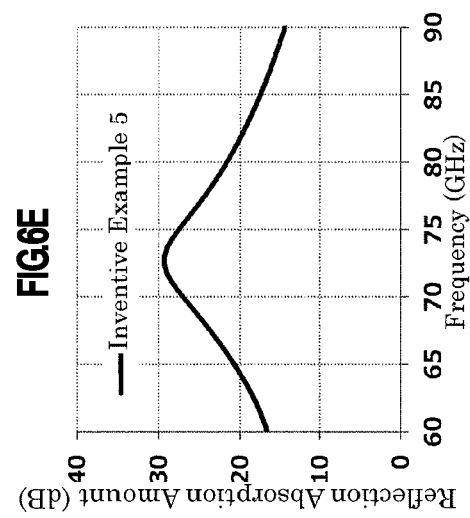
Figure 6F:
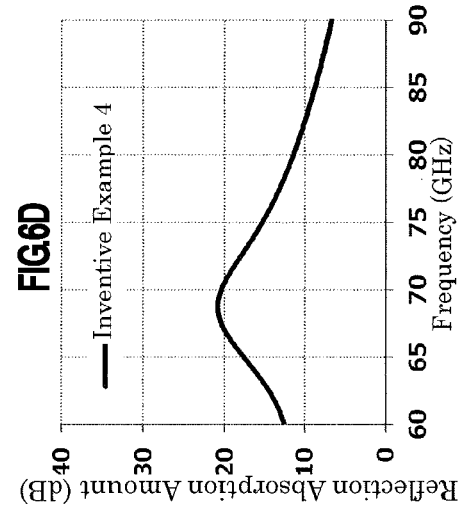

The electromagnetic wave absorber according to the aforementioned embodiment includes a laminate comprised of the dielectric layer E and the electrically conductive layer F. However, an additional layer other than these layers E and F may be provided in the electromagnetic wave absorber. Specifically, additional layers may be provided, for example, outside the dielectric layer F, between the dielectric layer E and the electrically conductive layer F, and outside the electrically conductive layer F. For example, the provision of a coating layer (not shown) between the dielectric layer E and the electrically conductive layer F prevents a component in the dielectric layer E from diffusing into the electrically conductive layer F to protect the electrically conductive layer F. Alternatively, the adhesive layer G may be provided outside the electrically conductive layer F, as shown in FIG. 5, to facilitate the attachment to another member (to-be-attached member). The materials of the coating layer and the adhesive layer G may be the same materials as those in the embodiment shown in FIG. 1.

EXAMPLES

The present disclosure will be described hereinafter in further detail using inventive examples and comparative examples. The present disclosure is not limited to the inventive examples to be described below within the scope of the present disclosure.

Electromagnetic wave absorbers in Inventive Examples 1 to 10 and Comparative Examples 1 and 2 were produced, which will be described below. For each of the electromagnetic wave absorbers, a reflection absorption amount was measured by irradiating each electromagnetic wave absorber with an electromagnetic wave at an oblique incidence angle of 15 degrees through the use of an electromagnetic wave absorber (electromagnetic wave absorbing material) and measuring return loss using a return loss measuring device LAF-26.5B available from Keycom Corporation, pursuant to JIS R 1679 (Measurement methods for reflectivity of electromagnetic wave absorber in millimeter wave frequency). The results are shown in TABLE 1 below and in FIGS. 5 and 7.

Inventive Example 1

Pursuant to the method of providing the electromagnetic wave absorber shown in FIG. 1, an EVA resin (Evaflex EV250, with a relative dielectric constant of 2.45) available from Du Pont-Mitsui Polychemicals Co., Ltd. was pressed at 120° C. into a film having a thickness of 560 μm. Thus, the dielectric layer B was produced. A PET film (resin layer $D_1$) having a thickness of 38 μm on which ITO serving as the electrically conductive layer C was sputtered so as to have a surface resistance of 20Ω/□ was affixed to a second surface of the dielectric layer B so that the electrically conductive layer C faced the dielectric layer B. A PET film (resin layer $D_2$) having a thickness of 38 μm on which. ITO serving as the resistive layer A was sputtered so as to have a surface resistance of 380Ω/□ was affixed to a first surface of the dielectric layer B so that the resistive layer A faced the dielectric layer B. Thus, an intended electromagnetic wave absorber was provided.

Inventive Example 2

Pursuant to the method of providing the electromagnetic wave absorber shown in FIG. 1, an intended electromagnetic wave absorber was provided in substantially the same manner as in Inventive Example 1 except that the dielectric layer B was changed to that to be described below.

(Dielectric Layer B)

The dielectric layer B was produced by adding 50 parts by weight of barium titanate (BT-01) available from Sakai Chemical Industry Co., Ltd. to 100 parts by weight of an EVA resin (Evaflex EV250) available from Du Pont-Mitsui Polychemicals Co., Ltd.; kneading the resulting mixture in a mixing mill; and then pressing the kneaded mixture at 120° C. into a film having a thickness of 458 μm. The dielectric layer B had a relative dielectric constant of 3.90.

Inventive Example 3

Pursuant to the method of providing the electromagnetic wave absorber shown in FIG. 1, an intended electromagnetic wave absorber was provided in substantially the same manner as in Inventive Example 1 except that the dielectric layer B was changed to that to be described below.

(Dielectric Layer B)

The dielectric layer B was produced by adding 100 parts by weight of barium titanate (BT-01) available from Sakai Chemical Industry Co. Ltd. to 100 parts by weight of an EVA resin (Evaflex EV250) available from Du Pont-Mitsui Polychemicals Co, Ltd.; kneading the resulting mixture in a mixing mill; and then pressing the kneaded mixture at 120° C. into a film having a thickness of 397 μm. The dielectric layer B had a relative dielectric constant of 5.19.

Inventive Example 4

Pursuant to the method of providing the electromagnetic wave absorber shown in FIG. 1, an intended electromagnetic wave absorber was provided in substantially the same manner as in Inventive Example 1 except that the dielectric layer B was changed to that to be described below.

(Dielectric Layer B)

The dielectric layer B was produced by adding 200 parts by weight of barium titanate (BT-01) available from Sakai Chemical Industry Co., Ltd. to 100 parts by weight of an EVA resin (Evaflex EV250) available from Du Pont-Mitsui Polychemicals Co., Ltd.; kneading the resulting mixture in a mixing mill; and then pressing the kneaded mixture at 120° C. into a film having a thickness of 336 μm. The dielectric layer B had a relative dielectric constant of 7.25.

Inventive Example 5

Pursuant to the method of providing the electromagnetic wave absorber shown in FIG. 1, an intended electromagnetic wave absorber was provided in substantially the same manner as in Inventive Example 1 except that the dielectric layer B was changed to an olefin foam SCF100 available from Nitto Denko Corporation (with a relative dielectric constant of 1.07) which was sliced to a thickness of 822 μm and that the resistive layer A and the electrically conductive layer C were affixed to the dielectric layer B with acrylic pressure sensitive adhesives each having a thickness of 30 μm.

Inventive Example 6

Pursuant to the method of providing the electromagnetic wave absorber shown in FIG. 1, an intended electromagnetic wave absorber was provided in substantially the same manner as in Inventive Example 1 except that the dielectric layer B was changed to a polyester foam SCF T100 (with a relative dielectric constant of 1.09) which was sliced to a thickness of 793 μm and that the resistive layer A and the electrically conductive layer C were affixed to the dielectric layer B with acrylic pressure sensitive adhesives each having a thickness of 30 μm.

Inventive Example 7

Pursuant to the method of providing the electromagnetic wave absorber shown in FIG. 4, 300 parts by weight of carbonyl iron powder YW1 available from New Metals and Chemicals Corporation, Ltd. was added to 100 parts by weight of an EVA resin (Evaflex EV250) available from Du Pont-Mitsui Polychemicals Co., Ltd, and the resulting mixture was kneaded in a mixing mill. Then, the kneaded mixture was pressed at 120° C. into a film having a thickness of 1200 μm. Thus, the dielectric layer E was produced. The dielectric layer E had a relative dielectric constant of 6.50. An ITO film (with a surface resistance of 20Ω/□) serving as the electrically conductive layer F was affixed to one surface of the dielectric layer E. Thus, an intended electromagnetic wave absorber was provided.

Inventive Example 8

Pursuant to the method of providing the electromagnetic wave absorber shown in FIG. 4, an intended electromagnetic wave absorber was provided in substantially the same manner as in Inventive Example 7 except that an aluminum foil/PET composite film (available from UACJ Corporation; and including 7-μm aluminum foil and 9-μm PET) serving as the electrically conductive layer F was affixed to the dielectric layer E so that the aluminum foil surface faced the dielectric layer E.

Inventive Example 9

Pursuant to the method of providing the electromagnetic wave absorber shown in FIG. 1, an intended electromagnetic wave absorber was provided in substantially the same manner as in Inventive Example 1 except that the dielectric layer B was changed to a thermoplastic acrylic elastomer (Kurarity 2330, with a relative dielectric constant of 2.55) available from Kuraray Co., Ltd. which was pressed at 150° C. into a film having a thickness of 561 μm.

Inventive Example 10

Pursuant to the method of providing the electromagnetic wave absorber shown in FIG. 1, an intended electromagnetic wave absorber was provided in substantially the same manner as in inventive Example 1 except that the dielectric layer B was changed to a thermoplastic acrylic elastomer (Kurarity 2330, with a relative dielectric constant of 2.55) available from Kuraray Co., Ltd. which was pressed at 150° C. into a film having a thickness of 551 μm and that an aluminum foil/PET composite film (available from UACJ Corporation; and including 7-μm aluminum foil and 9-μm PET) serving as the resistive layer A was affixed to the dielectric layer B so that the aluminum foil surface faced the dielectric layer B.

Comparative Example 1

Pursuant to the method of providing the electromagnetic wave absorber shown in FIG. 1, an intended electromagnetic wave absorber was provided in substantially the same manner as in Inventive Example 1 except that the dielectric layer B was changed to that to be described below.

(Dielectric Layer B)

The dielectric layer B was produced by adding 300 parts by weight of barium titanate (BT-01) available from Sakai Chemical Industry Co., Ltd. to 100 parts by weight of an EVA resin (Evaflex EV250) available from Du Pont-Mitsui Polychemicals Co., Ltd.; kneading the resulting mixture in a mixing mill; and then pressing the kneaded mixture at 120° C. into a film having a thickness of 242 μm. The dielectric layer B had a relative dielectric constant of 14.0.

Comparative Example 2

Pursuant to the method of providing the electromagnetic wave absorber shown in FIG. 4, an intended electromagnetic wave absorber was provided in substantially the same manner as in Inventive Example 7 except that the dielectric layer E was changed to that to be described below.

(Dielectric Layer E)

The dielectric layer E was produced by adding 400 parts by weight of carbonyl iron powder YW1 available from New Metals and Chemicals Corporation, Ltd. to 100 parts by weight of an EVA resin (Evaflex EV250) available from Du Pont-Mitsui Polychemicals Co., Ltd.; kneading the resulting mixture in a mixing mill; and then pressing the kneaded mixture at 120° C. into a film having a thickness of 1200 μm. The dielectric layer E had a relative dielectric constant of 10.3.

TABLE 1

| | Dielectric layer | | 20-dB bandwidth (GHz) | Maximum peak frequency (GHz) | Maximum reflection absorption amount (dB) |
|---|---|---|---|---|---|
| | Relative dielectric constant | Thickness (μm) | | | |
| Inventive Example 1 | 2.45 | 560 | 14.3 | 80.0 | 31 |
| Inventive Example 2 | 3.90 | 458 | 19.4 | 81.9 | 36 |
| Inventive Example 3 | 5.19 | 397 | 10.0 | 78.5 | 26 |
| Inventive Example 4 | 7.25 | 336 | 3.0 | 68.7 | 21 |
| Inventive Example 5 | 1.07 | 822 | 17.4 | 72.7 | 29 |
| Inventive Example 6 | 1.09 | 793 | 16.5 | 71.6 | 29 |
| Inventive Example 7 | 6.60 | 1200 | 2.4 | 81.9 | 23 |
| Inventive Example 8 | 6.60 | 1200 | 2.9 | 80.2 | 24 |
| Inventive Example 9 | 2.55 | 561 | 15.6 | 74.6 | 33 |
| Inventive Example 10 | 2.55 | 538 | 10.3 | 78.0 | 25 |
| Comparative Example 1 | 14.0 | 242 | 0.0 | 78.5 | 15 |
| Comparative Example 2 | 10.3 | 1200 | 0.0 | 66.0 | 14 |

The results in TABLE 1 and FIGS. 6 and 7 show that the bandwidth of a frequency band in which a reflection absorption amount is not less than 20 dB is not less than 2 GHz within a frequency band of 60 to 90 GHz in Inventive Examples 1 to 10 and in particular that the bandwidth is as wide as not less than 10.0 GHz in Inventive Examples 1 to 3, 5, 6, 9 and 10. Also, the smaller the relative dielectric constant is, the wider the 20-dB bandwidth tends to be. In Comparative Examples 1 and 2, on the other hand, slight absorption performance is provided within the frequency band of 60 to 90 GHz, but absorption performance providing a reflection absorption amount of not less than 20 dB is not provided in any range.

Although specific forms in the present disclosure have been described in the aforementioned examples, the aforementioned examples should be considered as merely illustrative and not restrictive. It is contemplated that various modifications evident to those skilled in the art could be made without departing from the scope of the present disclosure.

The present disclosure, which is capable of providing the performance capability of absorbing unwanted electromagnetic waves over a long period of time in wide frequency bands, is preferably used for an electromagnetic wave absorber for a millimeter-wave radar for use in a vehicle collision avoidance system. The present disclosure may be used for other purposes of suppressing radio wave interference and reducing noise in an intelligent transport system (ITS) that performs information communications between vehicles, roads and persons and in a next generation mobile communication system (5G) using millimeter waves.

The invention claimed is:

1. An electromagnetic wave absorber, comprising:
    a dielectric layer;
    a resistive layer provided on a first surface of the dielectric layer; and
    an electrically conductive layer provided on a second surface of the dielectric layer and having a sheet resistance lower than that of the resistive layer,
    wherein the dielectric layer has a relative dielectric constant in a range of 1 to 5.19;
    wherein a thickness of the dielectric layer is in a range of 100 to 1000 μm;
    wherein the dielectric layer is formed of an acrylic resin or an ethylene-vinyl acetate copolymer; and
    wherein the electromagnetic wave absorber having a bandwidth of a frequency band in which an electromagnetic wave absorption amount is not less than 20 dB of not less than 5 GHz, within a frequency band of 60 to 90 GHz.

2. The electromagnetic wave absorber according to claim 1, wherein the dielectric layer is a polymer film.

3. The electromagnetic wave absorber according to claim 1, wherein the dielectric layer is a foam.

4. The electromagnetic wave absorber according to claim 1, wherein the dielectric layer contains at least one of a magnetic material and a dielectric material.

5. The electromagnetic wave absorber according to claim 1, wherein the resistive layer contains indium tin oxide.

6. The electromagnetic wave absorber according to claim 1, wherein a sheet resistance of the resistive layer is in a range of 320 to 500 Ω/□.

7. The electromagnetic wave absorber according to claim 1, wherein the electrically conductive layer contains indium tin oxide.

8. The electromagnetic wave absorber according to claim 1, wherein the electrically conductive layer contains at least one of aluminum and an alloy thereof.

9. The electromagnetic wave absorber according to claim 1, further comprising an adhesive layer, wherein the adhesive layer is provided outside the electrically conductive layer.

10. The electromagnetic wave absorber according to claim 1,
    wherein the dielectric layer contains a magnetic material and a dielectric material,
    wherein the magnetic material is at least one selected from the group consisting of electrically conductive carbon, magnetic powder of iron, magnetic powder of nickel, magnetic powder of ferrite, and metal carbonyl powder, and
    wherein the dielectric material is at least one selected from the group consisting of carbon powder, barium titanate, and lead zirconate titanate.

11. The electromagnetic wave absorber according to claim 1, wherein a thickness of the resistive layer is in a range of from 15 to 100 nm.

* * * * *